United States Patent
Lu et al.

(10) Patent No.: US 10,630,299 B2
(45) Date of Patent: Apr. 21, 2020

(54) SYSTEMS AND METHODS FOR FREQUENCY DOMAIN CALIBRATION AND CHARACTERIZATION

(71) Applicant: Intel Corporation, Santa Clara, CA (US)

(72) Inventors: Cho-Ying Lu, Hillsboro, OR (US); William Yee Li, Portland, OR (US); Khoa Minh Nguyen, Hillsboro, OR (US); Ashoke Ravi, Hillsboro, OR (US); Maneesha Yellepeddi, San Jose, CA (US); Binta M. Patel, Austin, TX (US)

(73) Assignee: Apple Inc., Cupertino, CA (US)

(*) Notice: Subject to any disclaimer, the term of this patent is extended or adjusted under 35 U.S.C. 154(b) by 0 days.

(21) Appl. No.: 16/458,609

(22) Filed: Jul. 1, 2019

(65) Prior Publication Data

US 2019/0393880 A1 Dec. 26, 2019

Related U.S. Application Data

(63) Continuation of application No. 15/354,066, filed on Nov. 17, 2016, now Pat. No. 10,340,923, which is a (Continued)

(51) Int. Cl.
| | |
|---|---|
| *H03L 7/085* | (2006.01) |
| *H03L 1/00* | (2006.01) |
| *H03L 7/099* | (2006.01) |
| *H03L 7/091* | (2006.01) |
| *H03L 7/08* | (2006.01) |

(52) U.S. Cl.
CPC ............... *H03L 7/085* (2013.01); *H03L 1/00* (2013.01); *H03L 7/08* (2013.01); *H03L 7/091* (2013.01); *H03L 7/0991* (2013.01); *H03L 7/0992* (2013.01); *H03L 2207/50* (2013.01)

(58) Field of Classification Search
USPC .................................. 327/147–149, 156–158
See application file for complete search history.

(56) References Cited

U.S. PATENT DOCUMENTS

| | | | |
|---|---|---|---|
| 8,786,341 B1 * | 7/2014 | Weltin-Wu | ........... H03L 7/1972 327/159 |
| 9,148,153 B2 * | 9/2015 | Lu | .............................. H03L 1/00 |

(Continued)

OTHER PUBLICATIONS

Notice of Allowance dated Sep. 7, 2016, U.S. Appl. No. 14/857,145.
(Continued)

*Primary Examiner* — Adam D Houston
(74) *Attorney, Agent, or Firm* — Eschweiler & Potashnik, LLC

(57) ABSTRACT

A system for assigning a characterization and calibrating a parameter is disclosed. The system includes a frequency measurement circuit and a finite state machine. The frequency measurement circuit is configured to measure frequencies of an oscillatory signal and to generate a measurement signal including measured frequencies. The finite state machine is configured to control measurements by the frequency measurement circuit, to assign a characterization to a parameter based on the measurement signal, and to generate a calibration signal based on the characterized parameter.

18 Claims, 7 Drawing Sheets

Related U.S. Application Data continuation of application No. 14/857,145, filed on Sep. 17, 2015, now Pat. No. 9,537,495, which is a continuation of application No. 14/143,116, filed on Dec. 30, 2013, now Pat. No. 9,148,153.

(56) References Cited

U.S. PATENT DOCUMENTS

| | | | | |
|---|---|---|---|---|
| 2002/0044620 | A1* | 4/2002 | Spijker | H03L 7/085 375/371 |
| 2008/0072025 | A1* | 3/2008 | Staszewski | H03L 7/0992 712/241 |
| 2008/0094147 | A1 | 4/2008 | Olsson et al. | |
| 2009/0302908 | A1* | 12/2009 | Nakamura | H03L 7/0898 327/157 |
| 2012/0049913 | A1* | 3/2012 | Tadjpour | H03L 7/104 327/157 |
| 2012/0218014 | A1* | 8/2012 | Burg | H03L 7/113 327/156 |
| 2013/0241600 | A1* | 9/2013 | Da Dalt | H04B 15/04 327/105 |
| 2013/0249611 | A1* | 9/2013 | Vandepas | H03L 1/022 327/159 |
| 2014/0002288 | A1* | 1/2014 | Scholz | H03M 1/66 341/144 |
| 2014/0003551 | A1* | 1/2014 | Yang | H03L 7/0814 375/295 |
| 2014/0097878 | A1* | 4/2014 | Sindalovsky | H03L 7/087 327/156 |
| 2014/0139277 | A1* | 5/2014 | Subramanian | H03L 7/0812 327/158 |
| 2014/0240011 | A1* | 8/2014 | Hoeppner | H03L 7/08 327/147 |
| 2014/0266342 | A1* | 9/2014 | Arai | H03L 7/099 327/156 |
| 2014/0266354 | A1* | 9/2014 | Boo | H03L 7/08 327/159 |
| 2014/0333358 | A1* | 11/2014 | Kim | H03L 7/1974 327/159 |
| 2014/0368242 | A1* | 12/2014 | Unruh | H03L 1/00 327/156 |
| 2015/0008961 | A1* | 1/2015 | Kim | H03L 7/085 327/12 |
| 2015/0116018 | A1* | 4/2015 | Chen | H03L 7/091 327/159 |
| 2015/0145567 | A1* | 5/2015 | Perrott | H03L 7/093 327/156 |
| 2015/0188547 | A1* | 7/2015 | Lu | H03L 1/00 327/159 |
| 2015/0188549 | A1* | 7/2015 | Puschini Pascual | G06F 1/08 327/156 |
| 2015/0222274 | A1* | 8/2015 | Cenger | H03L 7/08 327/156 |
| 2016/0036485 | A1* | 2/2016 | Nagaso | H03L 7/183 455/76 |
| 2016/0079992 | A1 | 3/2016 | Lu et al. | |
| 2017/0170833 | A1* | 6/2017 | Lu | H03L 1/00 |

OTHER PUBLICATIONS

Non-Final Office Action dated Feb. 18, 2016, U.S. Appl. No. 14/857,145.
Notice of Allowance dated Jun. 8, 2015, U.S. Appl. No. 14/143,116.
Non-Final Office Action dated Jun. 1, 2018 in connection with U.S. Appl. No. 15/441,603.
Non-Final Office Action dated Jun. 1, 2018 in connection with U.S. Appl. No. 15/354,066.
Notice of Allowance dated Feb. 14, 2019 in connection with U.S. Appl. No. 15/354,066.
Notice of Allowance dated Oct. 10, 2018 in connection with U.S. Appl. No. 15/441,603.

* cited by examiner

SYSTEMS AND METHODS FOR FREQUENCY DOMAIN CALIBRATION AND CHARACTERIZATION

REFERENCE TO RELATED APPLICATION

This application is a continuation of U.S. application Ser. No. 15/354,066 filed on Nov. 17, 2016, which is a continuation of U.S. application Ser. No. 14/857,145 filed on Sep. 17, 2015, which is a continuation of U.S. application Ser. No. 14/143,116 filed on Dec. 30, 2013, the contents of which are incorporated by reference in their entirety.

BACKGROUND

Phase locked loops (PLLs) are typically used to generate a relatively stable, low jitter high frequency clock (e.g., at 3-4 GHz) from a low frequency reference, such as 100 MHz. A digital phase locked loop (DPLL) is a digital version of the PLL. The DPLL generally includes two sensitive components, a digitally controlled oscillator (DCO) and a time to digital converter (TDC). However, the performance of these components can shift to unknown values/characteristics.

The DCO generates an oscillatory output which frequency is controlled by a digital input. The gain of the DCO (KDCO) is defined as a frequency shift per code change and usually changes with transistor, inductor and capacitor target number.

The TDC takes two oscillatory inputs and converts the delay between them into a digital word. The TDC essentially quantizes the time difference or phase difference and converts that into a digital representation.

Shifts in the performance of the DCO and/or TDC can degrade communication performance by generating noise, distortions, and the like.

DETAILED DESCRIPTION

Figure 1:
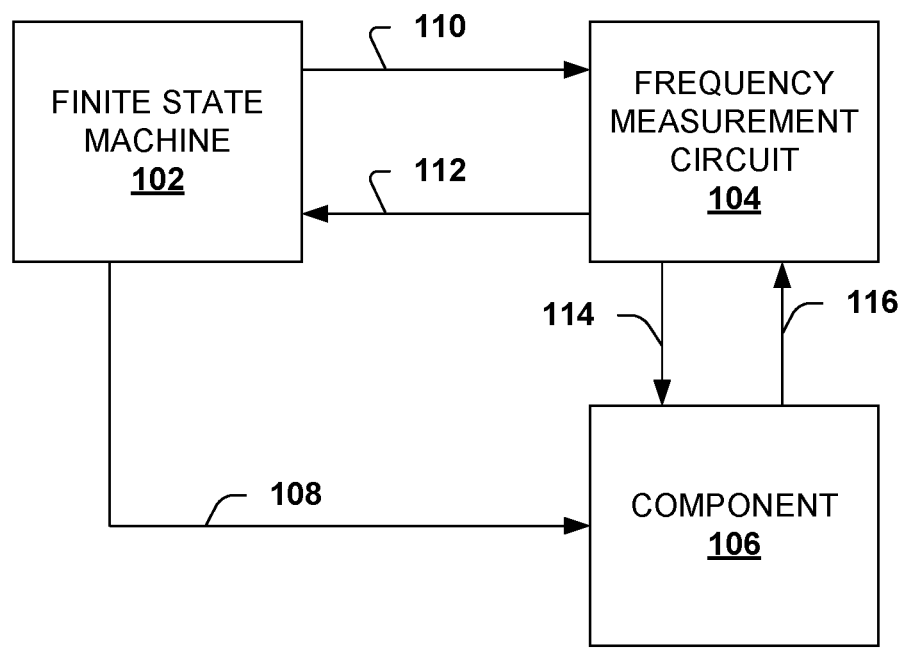
FIG. 1 is a block diagram illustrating a system for performing frequency domain calibration and characterization.

The present invention will now be described with reference to the attached drawing figures, wherein like reference numerals are used to refer to like elements throughout, and wherein the illustrated structures and devices are not necessarily drawn to scale.

Systems and methods are disclosed that facilitate time keeping with a main source of power being unavailable. The systems and methods include utilizing a non-oscillator technique of tracking or determining time without the main power so that when the main source resumes, the systems and the clock can operate properly. Instead of an oscillator, a real time clock (RTC) capacitor is used to determine elapsed time since the loss of power.

FIG. 1 is a block diagram illustrating a system 100 for performing frequency domain calibration and characterization. The system 100 is provided in a simplified form in order to aid understanding. The system 100 is typically used within a PLL system to facilitate providing a stable, clean clock.

The system 100 includes a finite state machine (FSM) 102, a frequency measurement circuit (FMC) 104 and facilitates assigning a characterization to and calibration of a component 106. The component 106 is a frequency based component that utilizes or generates signals having measurable frequencies. Typically, the component 106 substantially includes analog circuitry and, as a result, is sensitive to process, voltage, and temperature (PVT) variations. These variations, if not compensated for, can lead to unwanted frequency shifts, generation of noise and the like. The system 100 characterizes and calibrates the component 106 to detect and account for the PVT variations and mitigate frequency shifts and the like. Further, the system 100 increases the dynamic range and performance by the characterization and calibration.

In one example, the component 106 is a time to digital converter (TDC), which converts a timing and phase difference (a delay) between oscillatory inputs into a digital word. The system 100 facilitates characterization and calibration of the TDC and helps TDC resolution and a dynamic range.

In another example, the component 106 is a digital controlled oscillator (DCO). The DCO generates an oscillatory output whose frequency is controlled by a digital input. Additionally, the DCO has an associated gain, $K_{DCO}$, defined as frequency shift per code change. Frequency shifts can degrade noise tracking capability, degrade high frequency clock purity, and the like.

Both TDC and DCO components are typically analog circuits and, as a result, are sensitive to process, voltage, and temperature (PVT) variations.

The FMC 104 measures a frequency of a received signal 116. The FMC 104 provides a measurement signal 112 to the FSM 102. The FMC 104 may also receive a timing control signal 110 from the FSM 102. The FMC 104 may provide an FMC adjustment signal 114, depending on the requirements of the component 106.

The FSM 102 receives the measurement signal 112 from the FMC and generates the timing control signal 110. Further, depending on the needs of the component 106, the FSM may provide a control signal 108 to the component 106.

It is also appreciated that the component 106 can include multiple components, such as a DCO and a TDC. In one example, the system 100 characterizes and calibrates the DCO and subsequently characterizes and calibrates the TDC. In another example, the system 100 characterizes and calibrates the TDC and subsequently characterizes and calibrates the DCO.

Figure 2A:
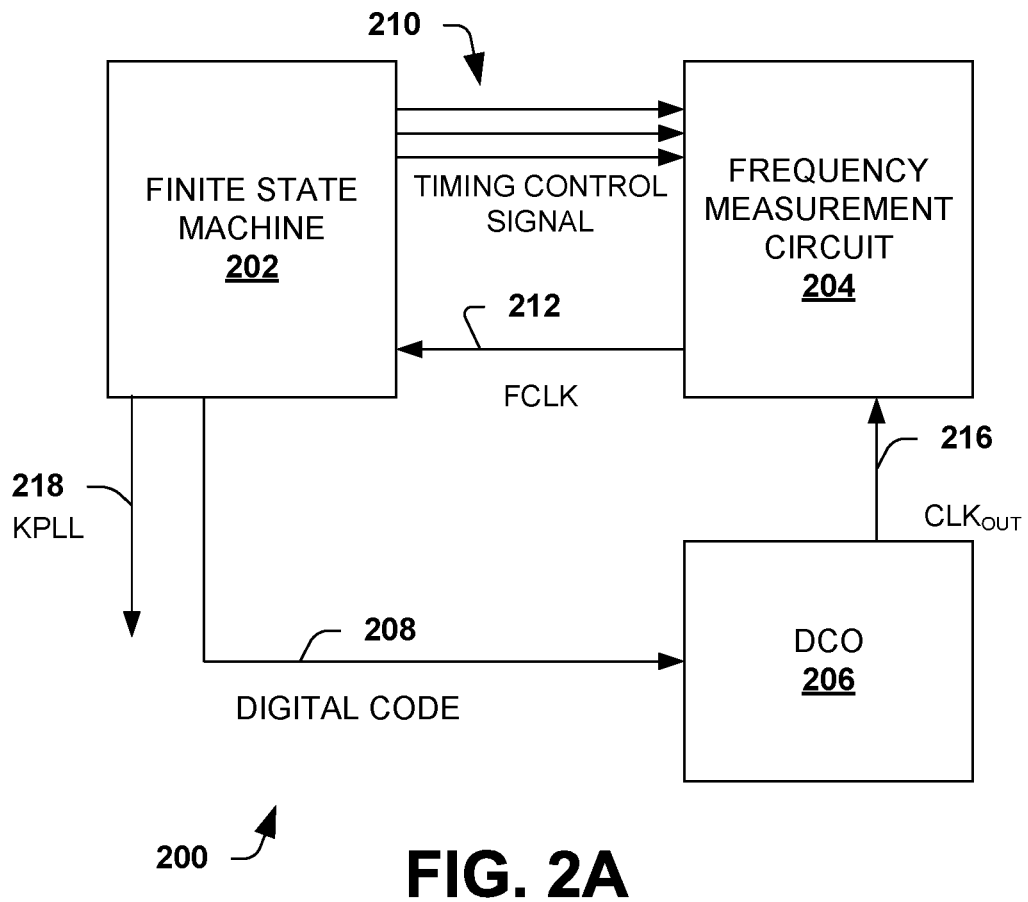
FIG. 2A is a block diagram illustrating a system for performing frequency domain calibration and characterization for a digital controlled oscillator.

FIG. 2A is a block diagram illustrating a system 200 for performing frequency domain calibration and assigning a characterization for a digital controlled oscillator. The system 200 monitors the frequency of the DCO and compensates for detected shifts.

The system 200 includes a finite state machine (FSM) 202 and a frequency measurement circuit (FMC) 204. The system 200 calibrates and characterizes digital controlled oscillator (DCO) 206. The FSM 202 and the FMC 204 are on die circuits.

The DCO 206 generates an oscillator signal as an output or clock output signal 216 and receives a digital input or code 208. The output signal 216 is generated based on the code 208 and can be utilized by other components, such as other components of a phase locked loop.

The DCO 206 and/or other components of a PLL have performance shifts that can undesireably shift the frequencies of the output signal 216. The performance shifts are due to process, voltage, and temperature (PVT) variations, such as manufacturing variations, including lot to lot variations, variations within a wafer, temperature, environmental conditions, power supply variations and the like. As a result, the DCO 206 output signal can be at a frequency varied from a selected or expected frequency.

A DCO gain, $K_{DCO}$, is defined as a frequency shift per code change. This is a gain based on a one/single bit of change in the digital code 208. This gain is dependent on components such as transistors, inductors and capacitors. These components can vary from target or specified values due to the fabrication and environment characteristics described above. As a result, the $K_{DCO}$ can vary.

Figure 2B:
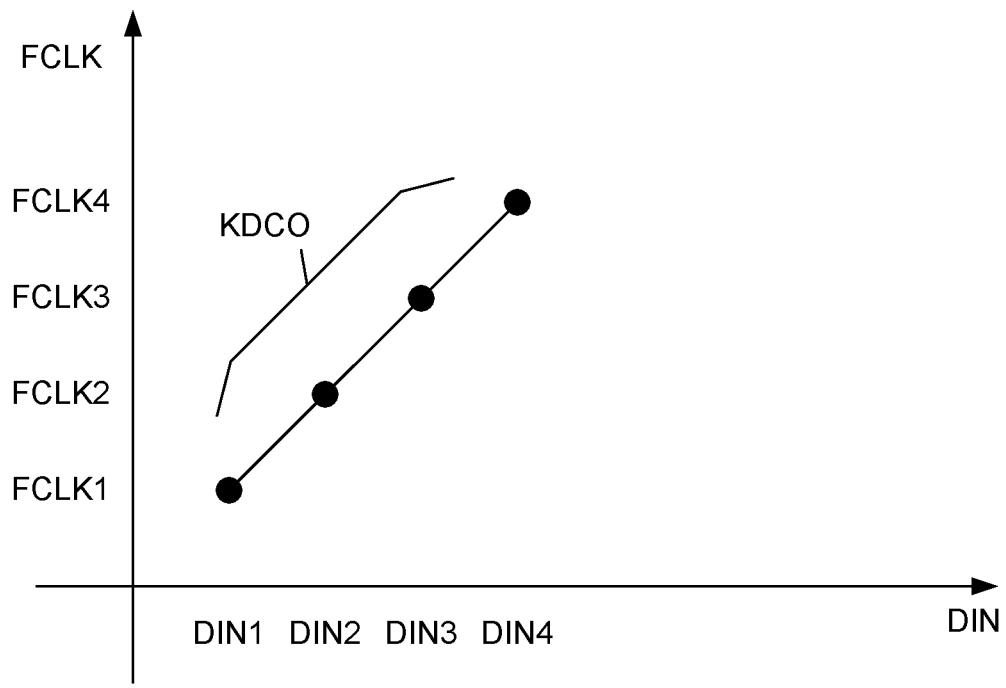
FIG. 2B is a graph depicting gain (KDCO) for a DCO.

FIG. 2B is a graph depicting gain ($K_{DCO}$) for a DCO. The graph is provided as an example to facilitate understanding.

The graph includes an x-axis depicting digital input or code 208 and a y-axis depicting increasing frequency of the output signal 216. Four individual codes are shown progressing along the x-axis, DIN1, DIN2, DIN3, and DIN4. Each is a one bit change from the previous code. On the y-axis, four corresponding output frequencies for the output signal 216 are shown as FCLK1, FCLK2, FCLK3, and FCLK4. The output frequencies correspond to the individual codes, one to one.

Thus, it can be seen that an increase in the code result in an increase in the output frequency. Here, the graph shows and plots that increase (can be decrease!) over the shown codes and the corresponding output frequencies. The rate of change or slope is referred to as the DCO gain, $K_{DCO}$. Ideally, the $K_{DCO}$ is constant for varied codes and output frequencies. However, if process, voltage and temperature (PVT) variations are present, PVT shifts can alter the $K_{DCO}$ and lead to non-linear behavior. These $K_{DCO}$ variations can lead to variations in the DPLL gain, $K_{PLL}$.

Returning to FIG. 2A, The FMC 204 measures the output signal 216 at multiple points and provides a measurement signal 212 that includes a frequency measurement of the output signal 216. The FMC 204 has a measurement duration based on a selected or desired accuracy for the measurement. The measurement duration is based on timing control signals 210.

The FSM 202 determines the measurement duration for measurements performed by the FMC 204 provides the digital code 208 to the DCO. The FSM 202 generates the one or more timing control signals 210 based on the measurement duration for the selected and/or desired accuracy. The FSM 202 adjusts and/or changes a control signal 218 based on the measurement signal 202 to compensate for measured shifts/variations. In one example, the control signal 218 is utilized to make gain adjustments to compensate for the shifts/variations.

Additionally, the FSM 202 determines the $K_{DCO}$ based on measurements from the measurement signal 212. As shown in FIG. 2B, the $K_{DCO}$ can be obtained by determining a slope between multiple points. It is appreciated that the obtained or determined $K_{DCO}$ may vary from a selected or expected $K_{DCO}$. However, the FSM 202 can account for variations in the $K_{DCO}$ by adjusting the digital code 208 and/or adjusting another parameter via the control signal 218.

For example, the gain of the PLL, referred to as KPLL, can be made via the control signal 218. Thus, the adjustments to the $K_{PLL}$ can be used with measured adjustments/variations to the selected $K_{DCO}$, by changing/adjusting the signal 218 to provide a constant value. The variations of the $K_{PLL}$ can compensate for variations in the DCO gain ($K_{DCO}$). Thus:

$$K_{DCO}*K_{PLL}=\text{Constant Value}$$

As a result, the overall gain is relatively constant, despite the PVT variations.

Figure 3:
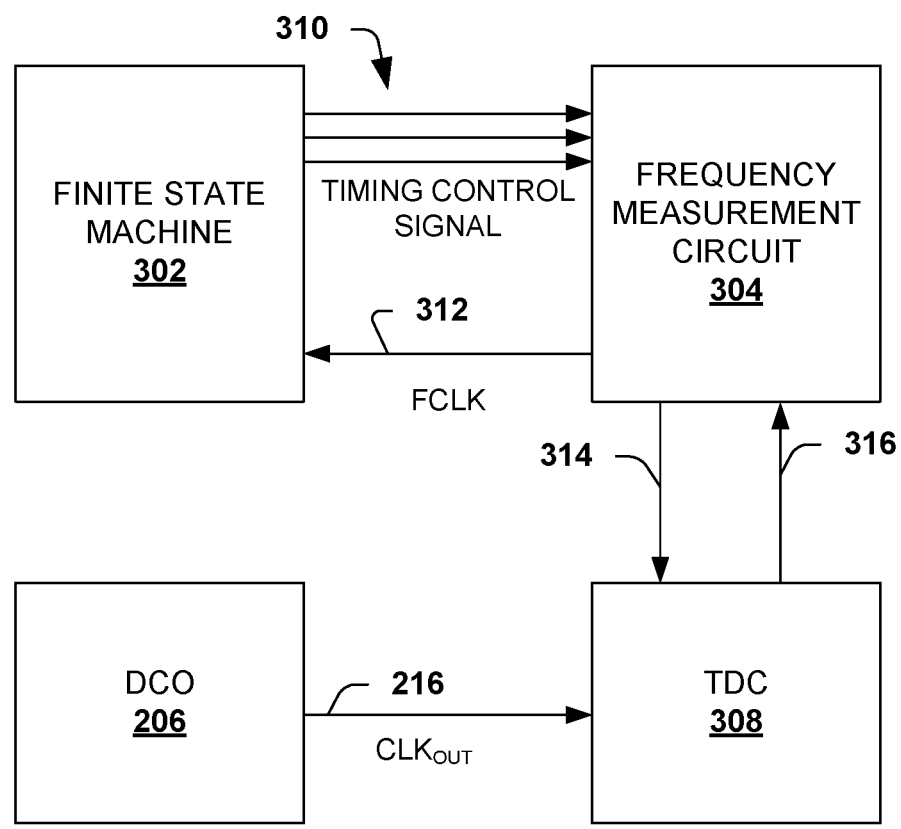
FIG. 3 is a block diagram illustrating a system for performing time to digital converter (TDC) calibration and characterization.

FIG. 3 is a block diagram illustrating a system 300 for performing time to digital converter (TDC) calibration and assigning a characterization. The system 300 calibrates and assigns a characterization to a parameter of a TDC component, which can be used in a PLL based system.

The system 300 can be used to for TDC calibration, can also be used for Vernier TDC calibration.

The system 300 includes a finite state machine (FSM) 302 and a frequency measurement circuit (FMC) 304. The system 300 calibrates and assigns a characterization for digital converter (TDC) 308. The FSM 302 and the FMC 304 are on die circuits.

The system 300 calibrates a delay line within the TDC 308. The TDC 308 includes a series of inverters, which are also referred to as a delay line. The delay of the inverters in the delay line is the resolution of the TDC. The TDC 308 is an open loop system in this example and functions like an oscillator by tying a last stage output to an input for the TDC 308 using, for example, a buffer or an inverter to have the TDC 308 input 216 and its output 316 at 180 degrees out of phase. Thus, the TDC 308 provides an oscillation signal as the output signal 316.

PVT variations can cause the inverters of the delay line to have delays varied from selected or expected values. These delay variations are adjusted or accounted for by the system 300 by using the FMC 304 and the FSM 302.

The FMC 304 extracts or measures a TDC close-loop oscillation frequency similar to the frequency measurements obtained by the FMC 204 of system 200. The measurement is performed on the TDC oscillation signal 316 and is provided as a frequency measurement signal 312.

The FSM 302 uses the measurement signal 312 to determine the delay/resolution of the delay line of the TDC 308. The TDC delay, which is the resolution of the TDC 308, is monitored as an inverse proportional relation to the measured oscillation frequency. The TDC delay is provided as a signal 310 back to the FMC 304.

The FMC 304 utilizes the delay signal (or control) 310 to calibrate the TDC 308 via the control/input signal 314.

Figure 4:
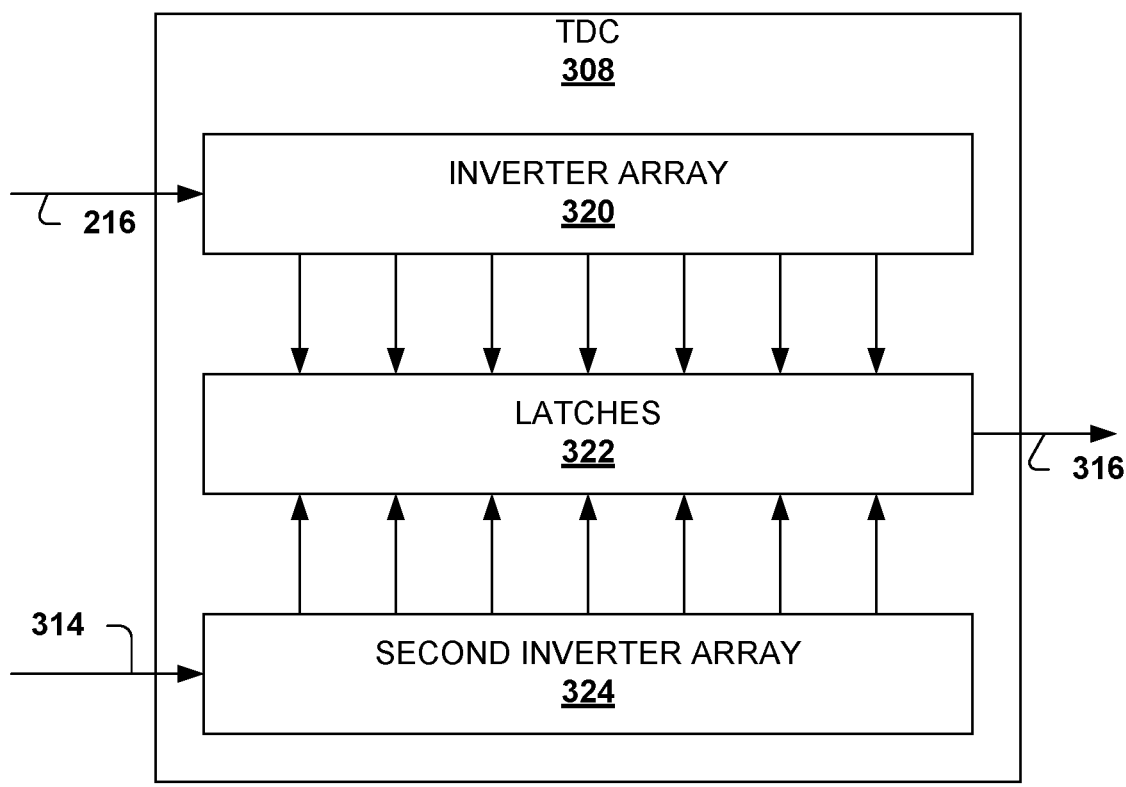
FIG. 4 provides a more detailed diagram of the TDC and can be utilized with the system, described above.

FIG. 4 provides a more detailed diagram 400 of the TDC 308 and can be utilized with the system 300, described above. The TDC 308 is shown as a Vernier type of TDC. Other types of TDCs are contemplated, such as TDCs that omit the second inverter array.

The TDC 308 includes inputs form receiving a DCO output 216 and an Xtal output (Xtal). The TDC 308 also provides its output or oscillation signal 316. The TDC 308, in this example, includes a first inverter array 320, latches 322, and a second inverter array 324. The first inverter array 320 sends inverted output signals to the latches 322 based on the DCO clock output 216 and FMC control/adjustment signal 314. The second inverter array 324 generates second inverted output signals to the latches 322 based on the Xtal output. The inverter array 320 provides the TDC output signal 316. In one example, the second inverter array 324 also provides the TDC output signal 316, wherein outputs of bother inverter arrays 320 and 324 are connected. The latches 322 generate a loop or feedback signal 736.

Figure 5:
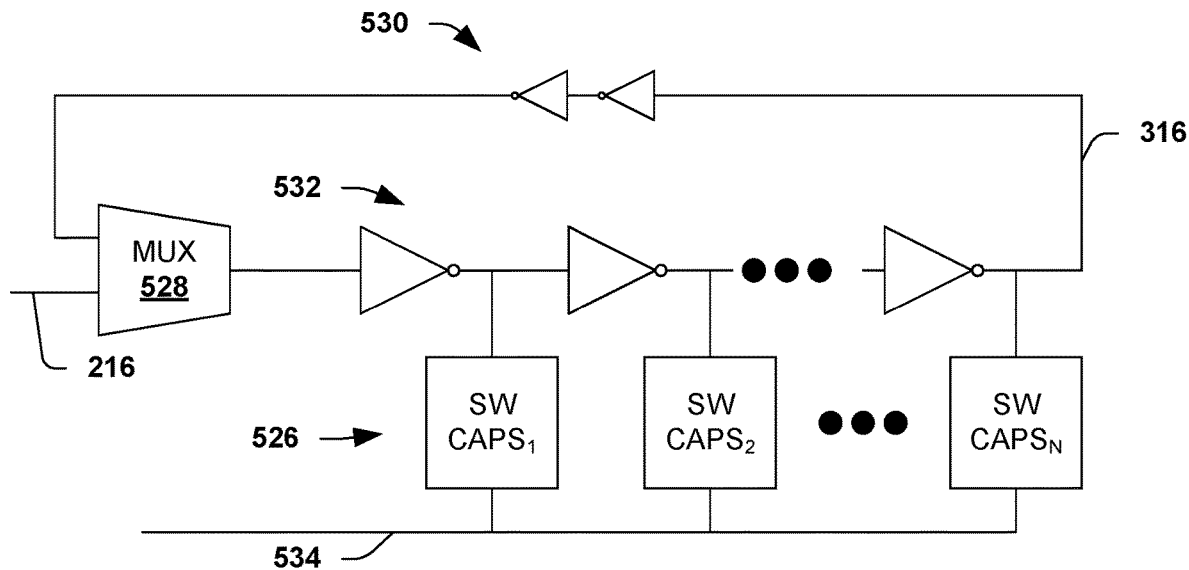
FIG. 5 is a diagram illustrating additional details for a first inverter array.

FIG. 5 is a diagram illustrating additional details for a first inverter array 320 and/or a second inverter array 324. This is provided merely as an example of a suitable configured for the first inverter array 320. Other types and configurations of inverter arrays are contemplated.

The array 320 includes a multiplexer 528 configured to receive the DCO clock output 216 or a feedback loop signal via feedback inverters 530. The number of feedback inverters 530 depends on a stage number. The loop formed by using the multiplexer 528 and the feedback inverters 530 results in oscillations at the output signal 316. The frequency of the oscillations is proportional to a delay of the inverter array 320.

An output of the multiplexer 528 is provided to a series of inverters 532. There are a total of N inverters connected in series and their outputs are connected to switchable capacitors 526. An FMC control signal 314 is provided to the switchable capacitors 526 to control and/or select a capacitance for stages of the inverters 532. It is noted that the output of the last inverter of the series of inverters 530 is 180 degrees varied from the DCO signal 216.

The switchable capacitors 526 are configured to adjust the delay of each inverter of the delay line according to the FMC control signal 314. The switchable capacitors 526 include one or more capacitors configured as an array. At least a portion of the capacitors can be turned ON or OFF, thus altering a capacitance for a particular switchable capacitor. The control signal 314 controls or alters the capacitance to provide a selected capacitance that corresponds to a selected or adjusted delay for the associated inverter.

In order to characterize the array 320, the switchable capacitors can be rotated through possible values in order to measure oscillation frequencies and determine the delay. Then, during operation, the switchable capacitors 526 are set to values that yield or closely yield selected delay values.

Figure 6:
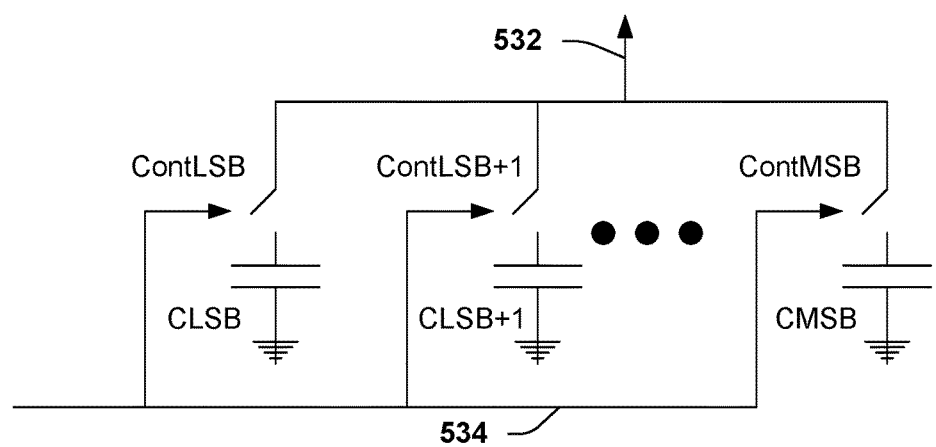
FIG. 6 is a diagram illustrating additional details for an example switchable capacitor of the switchable capacitors, described above.

FIG. 6 is a diagram illustrating additional details for an example switchable capacitor 5261 of the switchable capacitors, described above.

The control signal 314 provides a code that controls switches shown in FIG. 6. The code includes a number of bits from a least significant bit (LSB) to a most significant bit (MSB). Each bit controls a switch that connects a capacitance to the inverter output. Thus, the control signal 314 adjusts the capacitance and delay for the associated inverter of the delay line. Additionally, it is noted that the switchable capacitors 526 are used to control or adjust the delay, and, as a result, a resolution for the TDC 308.

Figure 7:
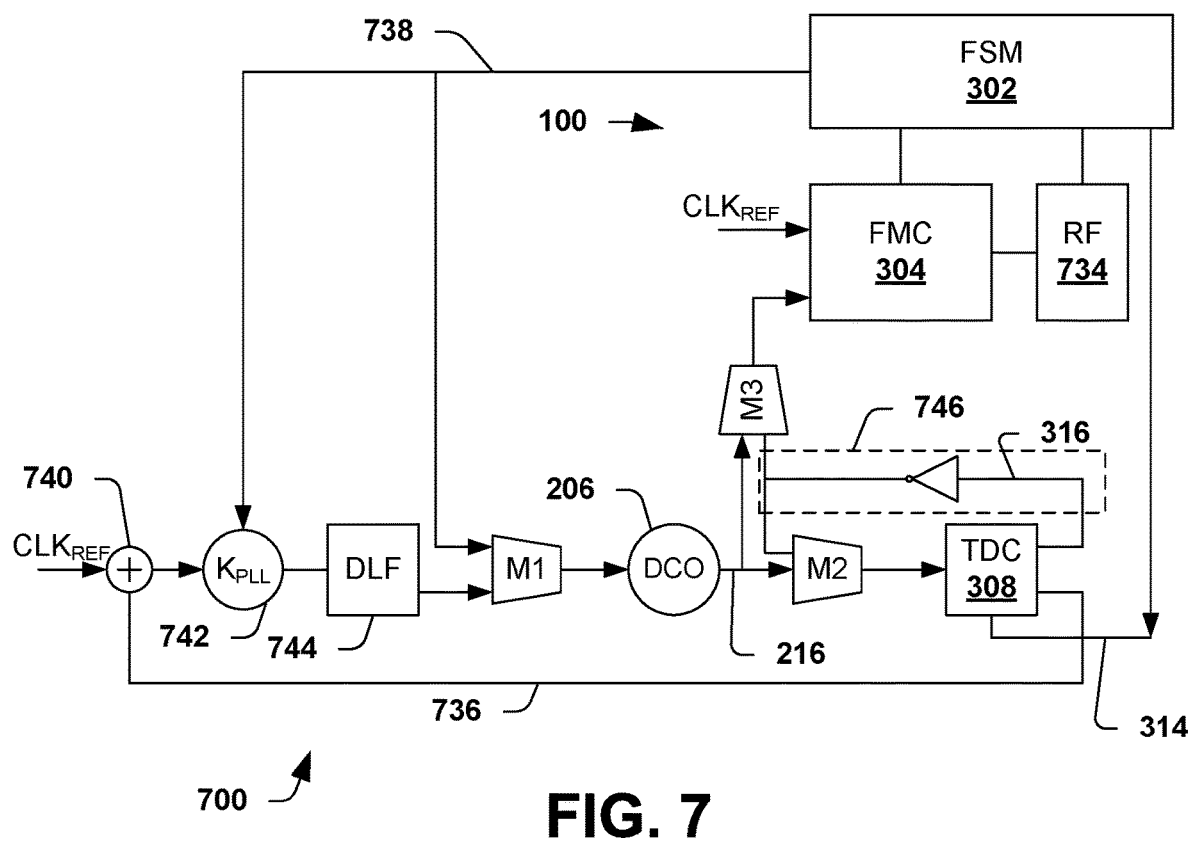
FIG. 7 is a diagram illustrating use of a characterization and calibration component in a DPLL system.

FIG. 7 is a diagram illustrating use of an assigned characterization and calibration component in a DPLL system 700. The system 700 is provided as an example and it is appreciated that other PLL systems and configurations can utilize the systems and methods described herein for characterizing and calibration components of PLL systems.

A gain component 742 receives an adjusted gain signal 738 from an FSM 302 and the TDC output signal 736 (also shown in FIG. 4). The adjusted gain signal 738 alters the PLL gain, described above as $K_{PLL}$.

The output of the gain component 742 is provided to a digital loop filter (DLF) 744. An output of the DLF 744 and the signal 208 are provided as inputs to a first multiplexor M1. The output signal from the first multiplexor M1 is provided as an input to a DCO 206, which is described above. An oscillator output 216 is provided to second and third multiplexors M2 and M3, as shown. The second and third multiplexors M2 and M3 also receive a buffered TDC output signal 316. The third multiplexor M3 is configured to selectively provide the TDC output signal 316 or the DCO output signal 216 to the FMC 304.

The TDC 308 receives the output from the second multiplexor M2 and a reference clock. The TDC 308 is adjusted or controlled by the code or calibration signal 314.

A calibration and characterization assignment system includes the FSM 302, the FMC 304 and a register file (RF) storage component 734. The FMC 304 measured a frequency of the output signal from the third multiplexor M3. The FMC 304 uses the reference clock and is controlled by the FSM 302. In one example, the FMC 304 includes a first counter that receives the output of the third multiplexor and a second counter that receives the reference clock. The two counters are used to obtain frequency measurements. The obtained measurements are stored using the RF storage component 734. The FSM 302 uses the measurements to characterize and calibrate the DCO 206 and the TDC 308, as described above. During calibration, the PLL loop is broken.

Figure 8:
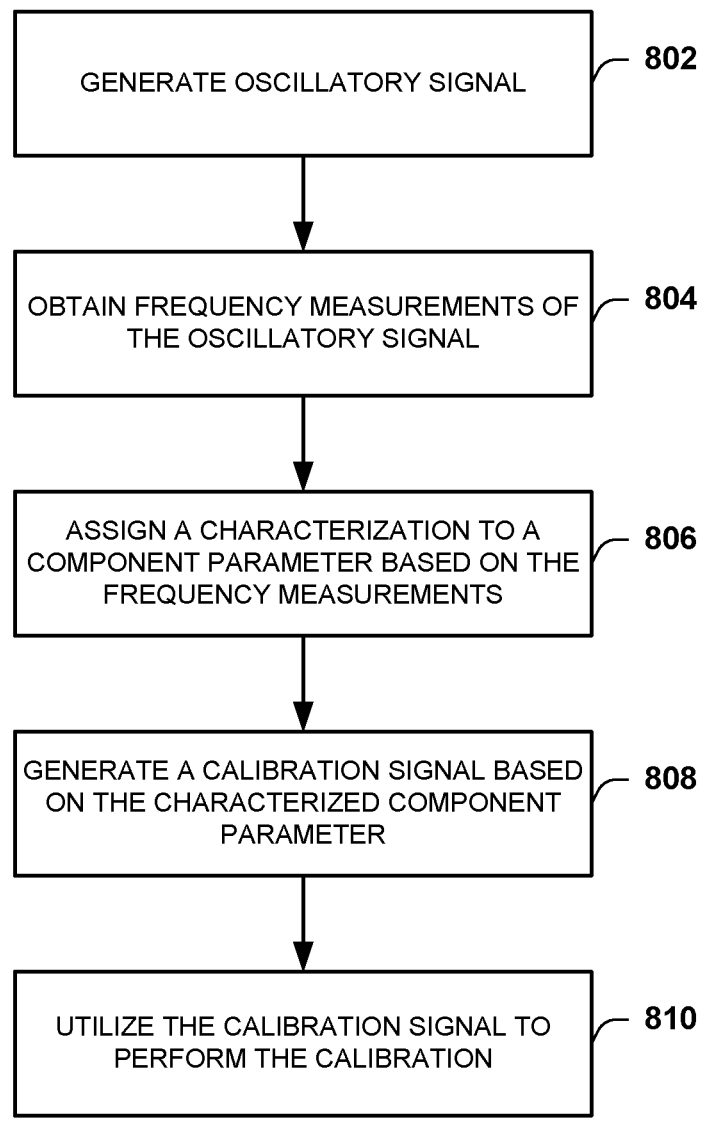
FIG. 8 is a flow diagram illustrating a method of calibrating and characterizing a component.

FIG. 8 is a flow diagram illustrating a method 800 of calibrating and characterizing a component. The component is typically an analog circuit within a system, such as a phase locked loop and is subject to PVT variations.

The method 800 begins at block 802 and a component, such as the component 106, generates an oscillatory signal. The oscillatory signal has frequencies or frequency components that can shift due to variations, such as PVT variations. These variations are described above in greater detail. The oscillatory signal is generated by a component with analogy circuitry, such as a digital controlled oscillator, a time to digital converter, and the like. The component is typically part of a system, such as a communication system, PLL, and the like.

Next, a frequency measurement circuit, such as one of those described above, obtains frequency measurements of the oscillatory signal at block 804.

A FSM, such as FSM 102, 202, and 302, assigns a characterization to a component parameter of the component at block 806 using the obtained frequency measurements. The component parameter is a characteristic or functionality of the component, such as a DCO gain, TDC delay, and the like. The characterization identifies frequency shifts from expected values due to variations, such as PVT variations.

In one example, the characterization identifies DCO gain variations from expected values. This can be determined by analyzing a plurality of obtained frequency measurements to determine the slope and then comparing the determined slope with an expected slope (the DCO gain).

The FSM generates a calibration signal based on the characterized component parameter at block 808. The calibration signal is typically generated to compensate for frequency shifts and the like identified by the characterization. The calibration signal may be provided to the component or another circuit/component.

In one example, the calibration signal alters a PLL gain to compensate for variations in a DCO gain. In another example, the calibration signal alters capacitance values for switching capacitors in a delay line of a TDC component to compensate for varied delays to PVT.

The calibration signal is utilized to calibrate for the characterized component parameter at block 810. For example, the calibration signal can be utilized to adjust a loop gain component of a PLL ($K_{PLL}$) or adjust switched capacitors of a TDC.

It is appreciated that additional component parameters can be characterized and calibrated for. For example, a TDC component can be characterized and calibrated using the method 800, and then a DCO can be characterized and calibrated using the method 800.

While the methods provided herein are illustrated and described as a series of acts or events, the present disclosure is not limited by the illustrated ordering of such acts or events. For example, some acts may occur in different orders and/or concurrently with other acts or events apart from those illustrated and/or described herein. In addition, not all illustrated acts are required and the waveform shapes are merely illustrative and other waveforms may vary significantly from those illustrated. Further, one or more of the acts depicted herein may be carried out in one or more separate acts or phases.

It is noted that the claimed subject matter may be implemented as a method, apparatus, or article of manufacture using standard programming and/or engineering techniques to produce software, firmware, hardware, or any combination thereof to control a computer to implement the disclosed subject matter (e.g., the systems shown above, are non-limiting examples of circuits that may be used to implement disclosed methods and/or variations thereof). The term "article of manufacture" as used herein is intended to encompass a computer program accessible from any computer-readable device, carrier, or media. Those skilled in the art will recognize many modifications may be made to this configuration without departing from the scope or spirit of the disclosed subject matter.

A system for assigning a characterization and calibrating a parameter is disclosed. The system includes a frequency measurement circuit and a finite state machine. The frequency measurement circuit is configured to measure frequencies of an oscillatory signal and to generate a measurement signal including measured frequencies. The finite state machine is configured to control measurements by the frequency measurement circuit, to assign a characterization to a parameter based on the measurement signal, and to generate a calibration signal based on the characterized parameter. In one example, the oscillatory signal is from a digital controlled oscillator. In another example, the oscillatory signal is from a time to digital converter.

In any of the above examples, the frequency measurement circuit includes a plurality of first and second counters. A first counter receives the oscillatory signal and a second counter receives a reference clock. The frequency measurement circuit uses the outputs of the first and second counters to generate the measured frequencies.

In any of the above examples, the finite state machine is configured to provide a timing control signal to the frequency measurement circuit.

In any of the above examples, the timing control signal is based on a selected accuracy.

In any of the above examples, the system further includes a component having the parameter and configured to generate the oscillatory signal.

In any of the above examples, the component is a digital controlled oscillator or a time to digital converter.

A system for characterizing and calibrating components in a phase locked loop is disclosed. The system includes a loop gain component, a digital controlled oscillator, a time to digital converter, and a characterization and calibration component. The loop gain component is configured to generate a first signal having a loop gain based on a gain calibration signal. The digital controlled oscillator is configured to generate an oscillatory signal from the first signal based on an oscillator calibration signal. The time to digital converter is configured to generate a time output signal from the oscillatory signal using a delay amount, wherein the delay amount is set according to a delay calibration signal. The characterization and calibration component is configured to generate the gain calibration signal, the oscillator calibration signal, and the delay calibration signal according to the oscillatory signal and the time output signal. In one example, the loop gain and a gain of the digital controlled oscillator combine to a constant value.

In any of the above examples, the time digital converter includes a delay line of inverters having inverter outputs coupled to switchable capacitors.

In any of the above examples, the switchable capacitors have capacitances selected according to the delay calibration signal.

A method for characterizing and calibrating a component is disclosed. Frequency measurements of an oscillatory signal are obtained. A component parameter is characterized based on the obtained frequency measurements. A calibration signal is generated based on the characterized component parameter. In one example, characterizing the component parameter includes identifying frequency shifts due to process, voltage and/or temperature variations. In another example, characterizing the component parameter includes identifying resolution shifts due to process, voltage and/or temperature variations.

Although the invention has been illustrated and described with respect to one or more implementations, alterations and/or modifications may be made to the illustrated examples without departing from the spirit and scope of the appended claims. For example, although a transmission circuit/system described herein may have been illustrated as a transmitter circuit, one of ordinary skill in the art will appreciate that the invention provided herein may be applied to transceiver circuits as well. Furthermore, in particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A system for calibrating a digitally controlled oscillator (DCO) parameter, the system comprising:
a frequency measurement circuit configured to measure a plurality of frequencies of an oscillatory signal generated by the DCO for a plurality of input digital control codes, respectively, and to generate a measurement signal for each of the plurality of frequencies; and a finite state machine configured to determine a parameter of the DCO based on the measurement signal for each of the plurality of frequencies, and to generate a calibration signal based on the determined parameter.

2. The system of claim 1, wherein the finite state machine is configured to output a control signal based on the calibration signal.

3. The system of claim 2, wherein the parameter comprises a gain of the DCO.

4. The system of claim 3, wherein the control signal controls a gain of a phase locked loop (PLL) in which the DCO operates, and wherein the control signal controls the PLL gain such that a product of the PLL gain and the DCO gain yield a constant value.

5. The system of claim 1, wherein the frequency measurement circuit includes a plurality of first and second counters, where a first counter receives the oscillatory signal and a second counter receives a reference clock, and wherein the frequency measurement circuit uses the outputs of the first and second counters to measure the frequencies of the oscillatory signal generated by the DCO.

6. The system of claim 1, wherein the finite state machine is configured to providing one or more timing control signals to the frequency measurement circuit, wherein the one or more timing control signals dictate a measurement duration of the frequency measurement circuit.

7. The system of claim 6, wherein the one or more timing control signals dictate an accuracy of the frequency measurement circuit.

8. A system for calibrating a time to digital converter (TDC) parameter, the system comprising:
a frequency measurement circuit configured to measure a frequency of an oscillatory signal generated by a portion of the TDC and output a measurement signal based thereon; and
a finite state machine configured to determine a parameter of the TDC based on the measurement signal,
wherein the frequency measurement circuit is further configured to generate a calibration signal based on the determined parameter from the finite state machine.

9. The system of claim 8, wherein the parameter is a TDC delay which characterizes a resolution of the TDC.

10. The system of claim 8, wherein the calibration signal comprises a control input signal to the TDC.

11. The system of claim 8, wherein the frequency measurement circuit includes a plurality of first and second counters, where a first counter receives the oscillatory signal and a second counter receives a reference clock, and wherein the frequency measurement circuit uses the outputs of the first and second counters to measure the frequencies of the oscillatory signal generated by the DCO.

12. The system of claim 8, wherein the portion of the TDC comprises a string of serially connected inverters that collectively form a delay line of the TDC in an open loop configuration, and form the oscillatory signal in a closed loop configuration.

13. A system for calibrating components in a phase locked loop, the system comprising:
a loop gain circuit configured to generate a first signal having a loop gain based on a gain calibration signal;
a digital controlled oscillator configured to generate an oscillatory signal from the first signal based on a oscillator calibration signal;
a time to digital converter configured to generate a time output signal from the oscillatory signal using a delay amount, wherein the delay amount is set according to a delay calibration signal; and
a calibration circuit configured to generate the gain calibration signal and the oscillator calibration signal according to the oscillator signal in a first mode, and the delay calibration signal according to the time output signal in a second mode.

14. The system of claim 13, wherein the calibration circuit is configured to control the gain calibration signal and the oscillator calibration signal so that the loop gain and a gain of the digital controlled oscillator combine to a constant value.

15. The system of claim 13, wherein the time to digital converter includes a delay line of inverters having inverter outputs coupled to switchable capacitors.

16. The system of claim 15, wherein the switchable capacitors have capacitances selected according to the delay calibration signal.

17. The system of claim 13, wherein the calibration circuit characterizes the time to digital converter and the digital controlled oscillator according to the oscillatory signal and the time output signal, respectively.

18. The system of claim 13, wherein the calibration circuit comprises a finite state machine and a frequency measurement component.

* * * * *